United States Patent [19]

Yonezawa

[11] Patent Number: 5,023,457
[45] Date of Patent: Jun. 11, 1991

[54] ELECTRON BEAM DEVICE
[75] Inventor: Akira Yonezawa, Tokyo, Japan
[73] Assignee: Seiko Instruments, Inc., Tokyo, Japan
[21] Appl. No.: 530,791
[22] Filed: May 30, 1990
[30] Foreign Application Priority Data
 May 30, 1989 [JP] Japan .................................. 1-136557
[51] Int. Cl.⁵ ............................................ H01J 37/14
[52] U.S. Cl. .............................. 250/396 ML; 250/310
[58] Field of Search ............ 250/396 R, 396 ML, 310
[56]   References Cited
U.S. PATENT DOCUMENTS 3,707,628 12/1972 Bassett et al. ............... 250/396 ML
3,870,891 3/1975 Mulvey ....................... 250/396 ML
4,882,486 11/1989 Kruit ........................... 250/396 ML
4,961,003 10/1990 Yonezawa .................... 250/396 ML Primary Examiner—Bruce C. Anderson
Attorney, Agent, or Firm—Spensley Horn Jubas & Lubitz

[57]   ABSTRACT

An unipolar magnetic field type objective lens used as an objective lens of an electron beam device. By properly adjusting the shape and strength of the objective lens, not only the aberration coefficients of the objective lens are reduced but also the secondary electrons emitted from a sample are efficiently detected to thereby allow semiconductor wafers of large diameter to be observed at a low acceleration voltage, a large angle of inclination, and with a high resolution.

4 Claims, 7 Drawing Sheets

ELECTRON BEAM DEVICE

BACKGROUND OF THE INVENTION

1. Field of the Invention

This invention relates to an electron beam device which allows semiconductor wafers of large diameter to be observed with low electron acceleration and high resolution by inclining the wafers at a large angle to the beam.

2. Description of the Prior Art

In the field of semiconductor development and manufacture, scanning electron microscopes (SEMs), which allow wafers of large diameter to be observed with high resolution, while causing them to be inclined at a large angle and applying a low acceleration voltage, have recently been in demand.

In response thereto, an SEM using a conical lens as its objective lens, as shown in FIG. 3, has been developed (Hitachi, Shimizu, et al., Japanese Institute of Electron Microscopes, 29-III-4, 1987). With such an SEM, a resolution of 20 nm has been attained at an angle of inclination of 60° with the application of an acceleration voltage of 1 KV.

However, this resolution is not satisfactory in terms of high resolution observation of semiconductor wafers.

Another type of the SEM providing high resolution is the so-called "in-lens SEM" in which a sample is interposed between the objective lens and a pole piece. Such an SEM has achieved a resolution of 5 nm or smaller at an acceleration voltage of 1 KV. Its resolution is satisfactory but the size small as about 10 mm diameter, thereby making it unsuitable for use in wafer observation.

As an objective lens of the SEM for observing samples of large diameter, it is conceivable to employ a unipolar magnetic field type objective lens. Characteristics of this unipolar magnetic field type lens, including the magnetic field distribution and the aberration coefficient, have been analyzed (Juma, S. M. and Mulve, T., Insti. Phys. Conf. Ser. 52, 1980, pp. 59-60, etc.).

However, the analysis presented in that paper is confined to the type of objective lens in which, as illustrated in FIG. 4, the magnetic pole end surface 11 of an inner tube 10 and the magnetic pole surface 9 of the outer periphery 8 of the lens are in the same plane and the inner tube 10 has no conical surface; moreover that paper discusses no specific structure, including secondary electron detection.

Also, a unipolar magnetic field type lens used as an electron beam tester has been known as well (Japanese patent laid-Open Application No. 69135/1988). This publication discloses, however, no details regarding the shape and dimensions of a unipolar magnetic field objective lens having a small aberration coefficient and allowing a high resolution image to be obtained.

As described previously, further improvements in the degree of integration of VLSIs will unquestionably increase the need to observe wafers of large diameter with a resolution higher than ever at a large angle of inclination and a low acceleration voltage.

BRIEF SUMMARY OF THE INVENTION

An object of this invention is to satisfy the above demand by providing a scanning type electron beam device using, as its objective lens, a unipolar magnetic field type lens constructed to provide high resolution.

A more specific object of this invention is to provide a scanning type electron beam device capable of observing a sample with a resolution surpassing that of the conventional lens, e.g., the above-mentioned conical lens hose resolution is 20 nm, even when the sample is inclined at a large angle. Such an electron beam device, of course, allows the sample to be observed with a still better resolution when the sample is inclined at a small angle or placed flat.

The above and other objects are achieved, according to the inventor, by the provision of a device having a unipolar magnetic field type objective lens whose magnetic pole end surface is positioned ahead of a sample as viewed from an electron beam source, the unipolar magnetic field type objective lens being characterized in that: a secondary electron beam detector is arranged ahead of the magnetic pole end surface of the inner tube of the objective lens; the inner tube of the objective lens has a cylindrical base, and comprises not only the magnetic pole end surface arranged on the end part of the inner tube but also a conical part which is tapered and connected to both the base and the magnetic pole end surface; the relationship among the diameter $D_o$ of an intersecting circle formed between the magnetic pole end surface and the conical surface of the conical part, both of the inner tube of the objective lens, the diameter $D_i$ of an electron beam passage hole formed on the magnetic pole end surface, and the diameter $D_c$ of an intersecting circle formed between the conical surface and the base is 4 mm $\leq D_i \leq D_o \leq$ 18 mm $< D_c$; an angle $\Theta$ formed between the conical part and the magnetic pole end surface, both of the inner tube of the objective lens, is $50° \leq \Theta \leq 70°$; and the magnetic pole surface of the outer tube surrounding the inner tube is located closer to the electron beam source than the magnetic pole end surface of the inner tube, and the relationship between working distance W between the sample and the magnetic pole end surface and a magnetomotive force $J\sqrt{U}$ for focusing an electron beam flux on the sample at an acceleration voltage U is $$J/\sqrt{U} > (7.1 (D_o/W)+2.2) \times (0.19 [(D_c/D_o)-1]+1)$$

According to an additional feature of the inVention, in the novel electron beam device described above, the outer periphery of the base of the inner tube of the objective lens forms an inclined surface that is tapered toward the conical part.

According to a further feature of the invention, the electron beam device, is constructed such that an inclined surface having an angle smaller than that of the conical surface is arranged between the conical part and the magnetic pole end surface of the inner tube of the objective lens.

Embodiments of the invention may also include both of the features described above.

DESCRIPTION OF THE PREFERRED EMBODIMENTS

Figure 1:
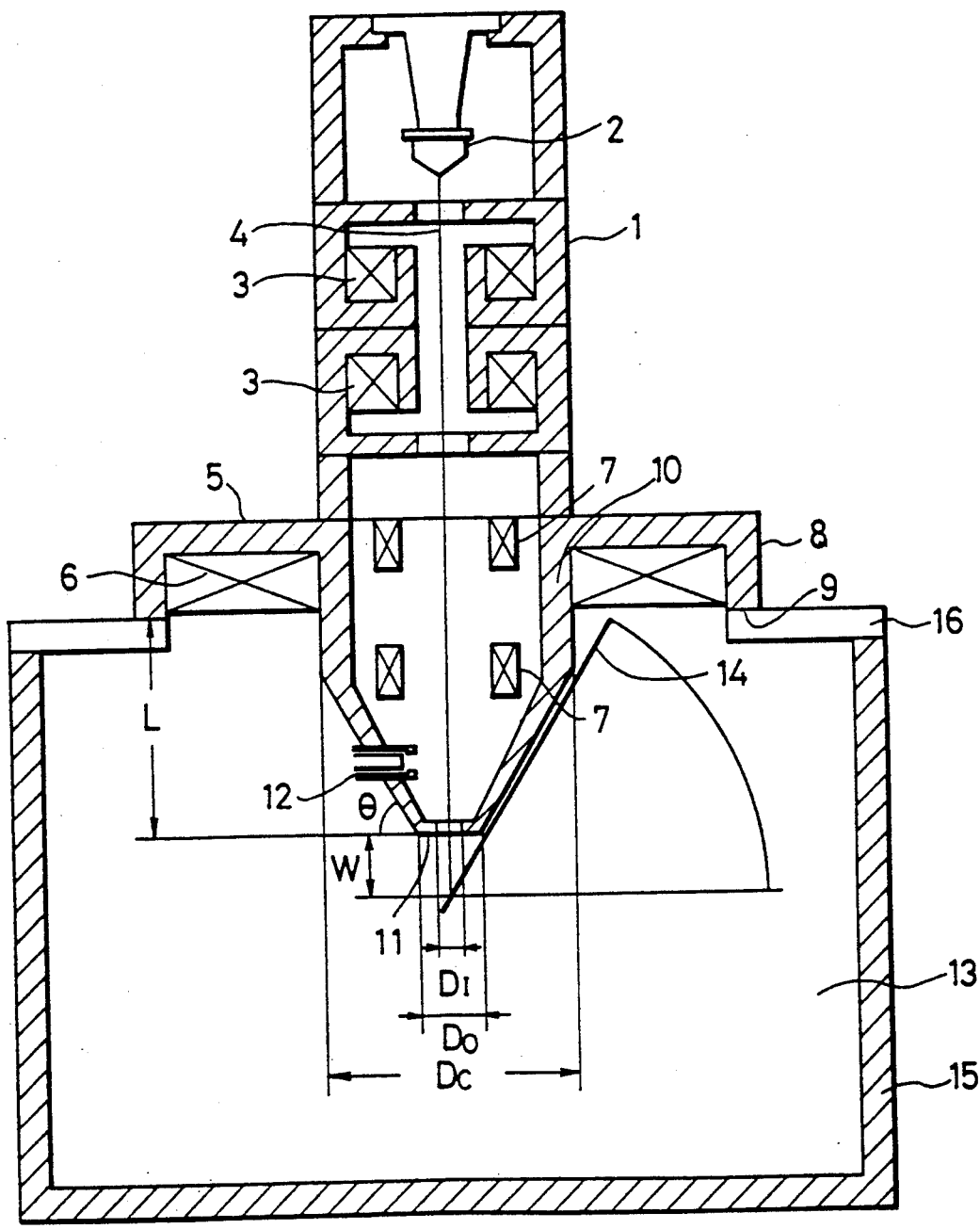
FIG. 1 is an elevational, cross sectional view showing an embodiment of the invention.

A first embodiment of this invention is shown in FIG. 1, and includes an electron beam device which comprises: an electron gun 2 for producing an electron beam 4, convergent lenses 3, a unipolar magnetic field type objective lens 5, and a sampling chamber 13. The unipolar magnetic field type objective lens 5 is arranged so as to have an inner tube 10 located along the axis of electron beam 4 ahead of a sample as viewed from the electron beam source 2. Tube 10 has a magnetic pole end surface 11. Ahead of magnetic pole end surface are secondary electron detector 12 and beam deflecting coils 7.

An electron beam 4 projected from electron gun 2 is first converged by convergent lenses 3 and is then converged by unipolar magnetic field type objective lens 5 onto sample 14. A secondary electron beam 17 (see FIG. 6) emitted from sample 14 first passes through a hole provided in magnetic pole end surface 11 and then is detected by the secondary electron detector 12.

Inner tube 10 has a conical portion whose angle of inclination Θ is about 60°. This conical portion is connected to the cylindrical surface of inner tube 10 whose diameter is $D_c$.

The diameter $D_o$ of the magnetic pole end surface 11, the diameter $D_i$ of the hole arranged in this end surface, and the diameter $D_c$ of the cylindrical surface of the inner tube 10 of the unipolar magnetic field type objective lens are, as previously described, selected so that they satisfy the relationship: 4 mm $\leq D_i < D_o \leq$ 18 mm $< D_c$.

Lens 5 further has an outer tube 8 having magnetic pole end surface 9 which is set back toward the electron beam source with respect to the magnetic pole end surface 11 of inner tube 10. Outer tube 8 is connected to the sampling chamber 13, made of a magnetic material, through a nonmagnetic connecting part 16, (a feature which was conceived by applicant and disclosed in Japanese Patent Application No. 279987/88).

The large diameter sample 14 can be inclined as much as about 60° to a place normal to beam 4. The sample 14 is placed at a sample position W which is determined by the magnitude of the diameter $D_o$ of end surface 11.

The principle of operation of the unipolar magnetic field type lens will now be described with reference to FIG. 4 which shows a unipolar magnetic field type lens 5 in which a magnetic pole end surface 11 of an inner tube 10 and a magnetic pole surface 9 of an outer tube 8 lie in the same plane. The magnetic field distribution of this structure has been reported, as previously described, by Juma and others.

The spherical aberration coefficient $C_s$ and the color aberration coefficient $C_c$ of the unipolar magnetic field type objective lens can be determined from the magnetic field distribution of this lens based on a known integral equation which will not be described herein.

Figure 5:
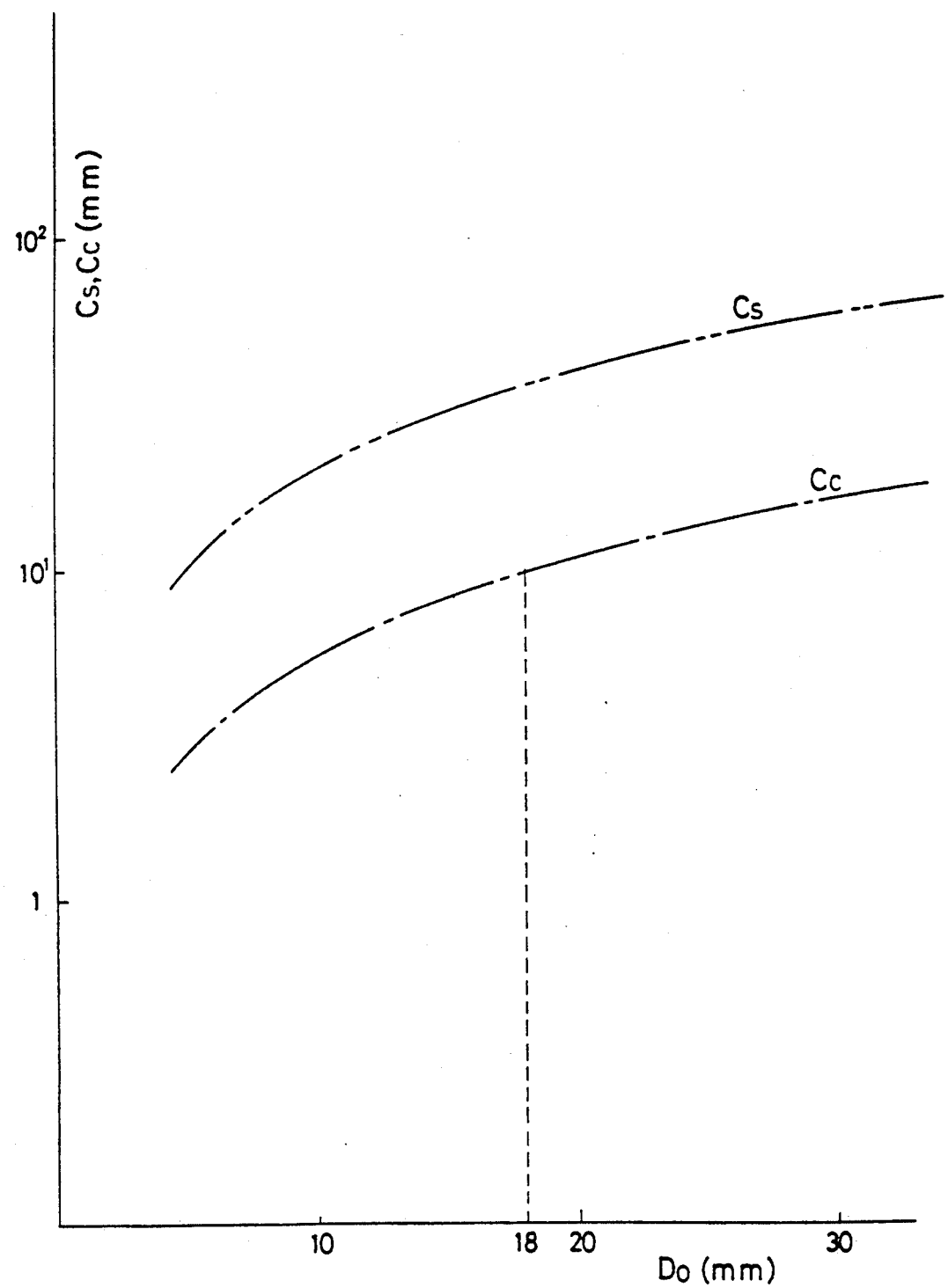
FIG. 5 is a diagram showing the relationship between aberration coefficients $C_s$ and $C_c$ and the magnetic pole end surface diameter $D_o$ at a minimum working distance in the case where a sample is inclined at 60°.

If it is supposed that the angle of inclination of a sample 14 having a diameter larger than the diameter $D_o$ of the magnetic pole end surface 11 is a maximum of 60°, the minimum working distance (distance between the objective lens and the sample) W is: $(D_o/2)\tan 60°$. A graphical representation of the respective aberration coefficients $C_s$ and $C_c$ calculated using the equation with respect to Do is shown in FIG. 5.

Here, in order to obtain a resolution of a secondary electron image of 10 nm or smaller at an acceleration voltage of 1 KV, it is required that $C_c \leq 10$ mm. Hence, a requirement such as $D_o \leq 18$ mm is obtained from FIG. 5.

That is, in order to observe a sample 14 of large diameter with a high resolution of 10 nm or smaller by subjecting the sample to the application of the acceleration voltage (1 KV) while the sample is inclined at a large angle (60°), it is understood that the diameter of the magnetic pole end surface of the unipolar magnetic pole end surface of the unipolar magnetic field lens must be 18 mm or smaller.

Figure 4:
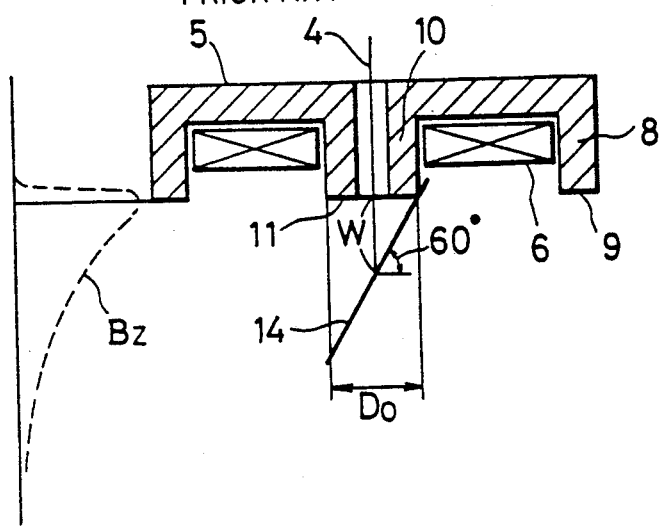
FIG. 4 is a cross-sectional detail view showing the concept of the known unipolar magnetic field type objective lens.
Figure 6:
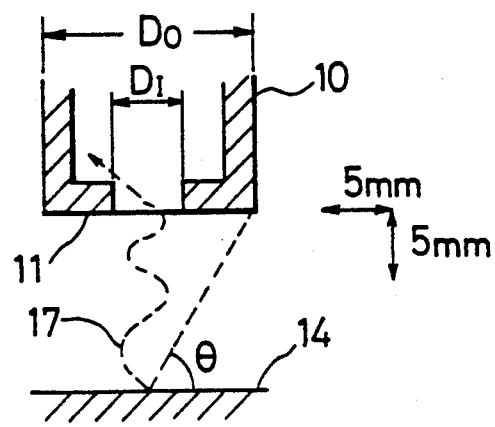
FIG. 6 is a cross-sectional detail view showing the trajectory along which a secondary electron emitted from a sample enters into a hole in the objective lens.

A secondary electronic beam resulting from irradiation of a primary electron beam onto sample 14 is constrained in the vicinity of the optical axis by the magnetic field, as indicated by the field pattern Bz in FIG. 4, generated between magnetic pole end surface 11 of inner tube 10 and magnetic pole surface 9 of outer tube 8 so that, as shown in FIG. 6, secondary electron beam 17 travels toward magnetic pole end surface 11 of inner tube 10.

This secondary electron beam 17 passes through a hole (diameter $D_i$) arranged in magnetic pole end surface 11 and then is detected by a secondary electron detector (not shown) arranged within the inner tube 10.

Here, the diameter $D_i$ of the hole which the secondary electron beam can pass through will be calculated. When it is supposed that: $D_o = 15$ mm, the location of the sample $W = (D_o/2)\tan 60°$ (=13 mm); the acceleration voltage U is 1 KV; the energy of the secondary electron beam 17 is 10 V; and the angle formed between the secondary electron beam and the sample is 45°, the trajectory of the secondary electron beam 17 in the vicinity of the magnetic pole end surface 11 is shown in FIG. 6.

It is assumed from machining or strength viewpoints that the axial dimension, or depth, of the hole of diameter $D_i$ arranged in the magnetic pole end surface 11 is usually about 2 mm. In order for the secondary electron beam 17 to pass through the hole if it is 2 mm in depth, it is understood from its trajectory that the diameter $D_i$ of the hole is at least 4 mm.

Similar values are obtained in the case where: $U=500$ V and the energy of the secondary electron beam 17 is 5 V; or in the case where $D_o=5$ mm or the like.

The magnitude of the magnetomotive force for focusing the electron beam which the objective lens should satisfy will next be obtained.

Figure 7:
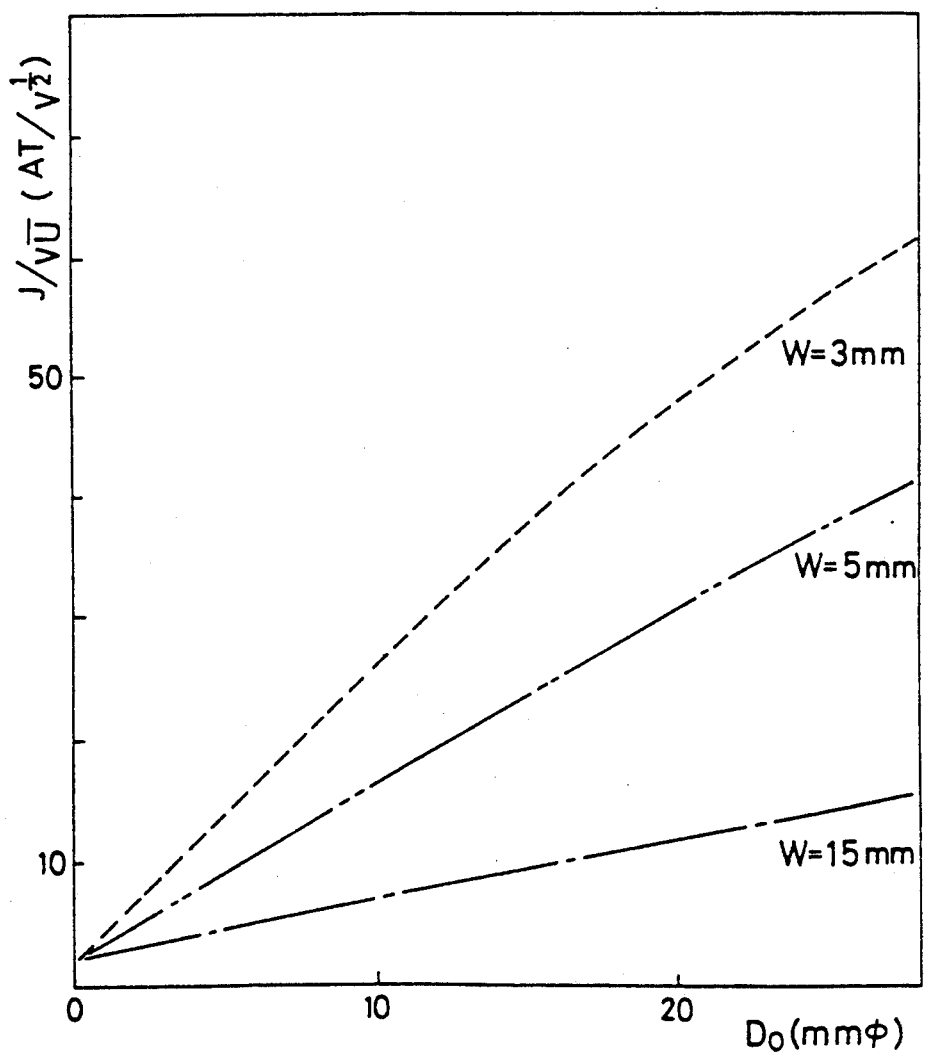
FIG. 7 is a diagram showing the relationship between a focusing magnetomotive force $J/\sqrt{U}$ and the magnetic pole end surface diameter $D_o$ of a unipolar magnetic field type objective lens.

The focusing magnetomotive force $J/\sqrt{U}$, (where U is in units of ampere-turns and U is in units of volts) of the unipolar magnetic field type lens with respect to the diameter $D_o$ of the magnetic pole end surface with the sample position as a parameter is shown in FIG. 7.

It is known from this Figure that $J/\sqrt{U}$, with $D_o$ being equal to or smaller than 18 mm and W being constant, is almost linear. Thus, from FIG. 7, it is derived that the focusing magnetomotive force can be given by the following equation.

$$J/\sqrt{U}=7.1 [(D_o/W)]+2.2 \qquad (1)$$

Of course, it is apparent that not only the respective aberration coefficients $C_s$ and $C_c$ but also the required magnetomotive force can be small as far as $D_o \leq 18$ mm.

On a practical level, the diameter $D_c$ of the inner tube of the unipolar magnetic field type lens must be larger (usually about 50 mm or greater) than $D_o$ ($\leq 18$ mm) since a deflection system will have to be assembled into the inner tube and magnetic saturation at the yoke must also be prevented. Thus, in order to cause the wafer of larger diameter to be inclined at about 60°, it is necessary to connect the end surface 11 diameter $D_o$ and the cylindrical surface (diameter $D_c$) of inner tube 10 via a conical portion whose inclination $\Theta$ is about 60° ($50° \leq \Theta \leq 70°$).

Figure 8:
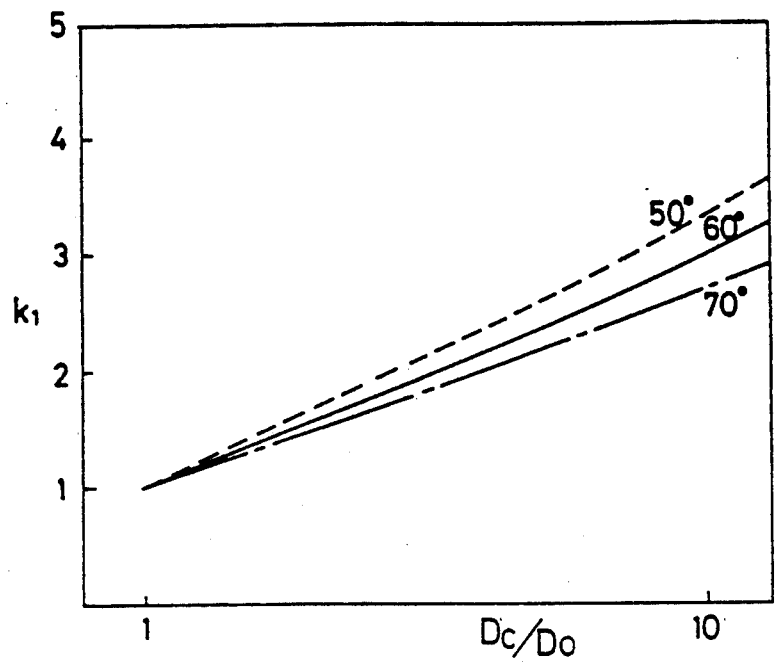
FIG. 8 is a diagram showing the ratio k1 of increase in the focusing magnetomotive force to a diameter ratio $D_c/D_o$ of the cylinder of the inner tube in the cases where the angle a conical surface forms with respect to a sample is 50°, 60°, and 70°.

It has been found that the focusing magnetomotive force $J/\sqrt{U}$ became larger than that indicated by equation (1) with the above arrangement. A ratio k of the focusing magnetomotive force in cases of $\Theta$ being 50°, 60°, and 70° relative to the case in which $D_c=D_o$, obtained from measurements of the magnetic field distribution, is shown in FIG. 8. It is apparent from FIG. 8 that $$k_1 = C [D_c/D_o = 1] + 1 \qquad (2)$$

where it is supposed that the coefficient C is 0.26, 0.22, and 0.19 in cases of $\Theta$ being 50°, 60°, and 70°, respectively.

Therefore, it is found that the focusing magnetomotive force of the unipolar magnetic field type lens having a conical surface whose inclination is about 60° ($50° \leq \Theta \leq 70°$) and which is connected to the cylindrical surface of the inner tube whose diameter is $D_c$ on the side opposite to $D_o$ is $$J/\sqrt{U}=(7.1 [D_o/W]+2.2) \times (C [D_c/D_o)-1]+1) \qquad (3)$$

In order to cause a wafer of large diameter to be inclined at a large angle, it is preferable that the magnetic pole surface of the outer tube is set back toward the electron beam side with respect to the magnetic pole end surface diameter ($D_o$) of the inner tube so that its possible collision with the wafer can be prevented.

It has been found that the focusing magnetomotive force $J/\sqrt{U}$ in this case becomes still larger than in equation (3).

Figure 9:
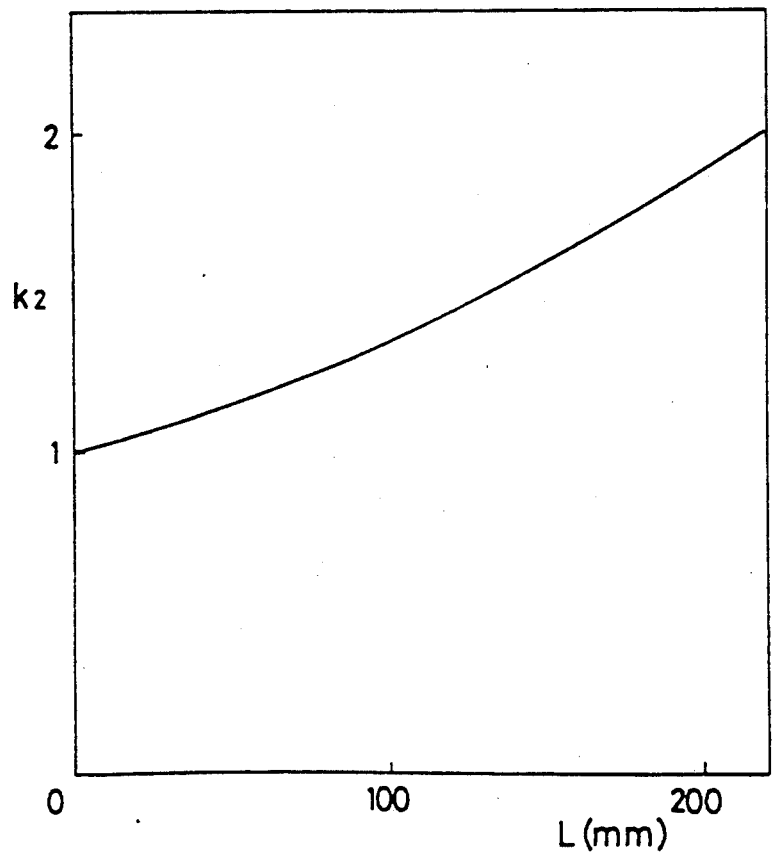
FIG. 9 is a diagram showing the ratio $k_2$ of increase in the focusing magnetomotive force in the case where the magnetic pole surface of the outer tube of a unipolar magnetic field type objective lens is set back a distance L with respect to the magnetic pole end surface of the inner tube.

That is, a ratio $k_2$ of the focusing magnetomotive force in the case where the magnetic pole surface 9 of the outer tube 8 is separated from the magnetic pole end surface 11 of the inner tube 10 by a distance L (see FIG. 1) to the focusing magnetomotive force in the case where $L=0$ is shown in FIG. 9.

When $L=50$ mm, $k_2=1.14$; while if $L=200$ mm, $k_2=1.9$. In the case where a wafer of 6 inches in diameter is inclined at angle of 60° to observe entire wafer surface, the distance between the sample position and the upper end of the wafer may be about 132 mm because $25.4 \times 6 \times \sin 60° = 132$ mm. At this time, the ratio $k_2$ is nearly equal to 1.5 from FIG. 9.

As is apparent from FIG. 1, it is possible to make the distance L, 132 mm, smaller without changing the angle of inclination, 60°, of the wafer. This, contributing to a reduction of the required focusing magnetomotive force $J/\sqrt{U}$, is advantageous. Although the diameter of wafers will likely increase in the future, too large a value of L will be disadvantageous in that it increases the required focusing magnetomotive force. It is found from FIG. 9 that L must be 200 mm or smaller in order to ensure that $k_2 \leq 2$.

Figure 2:
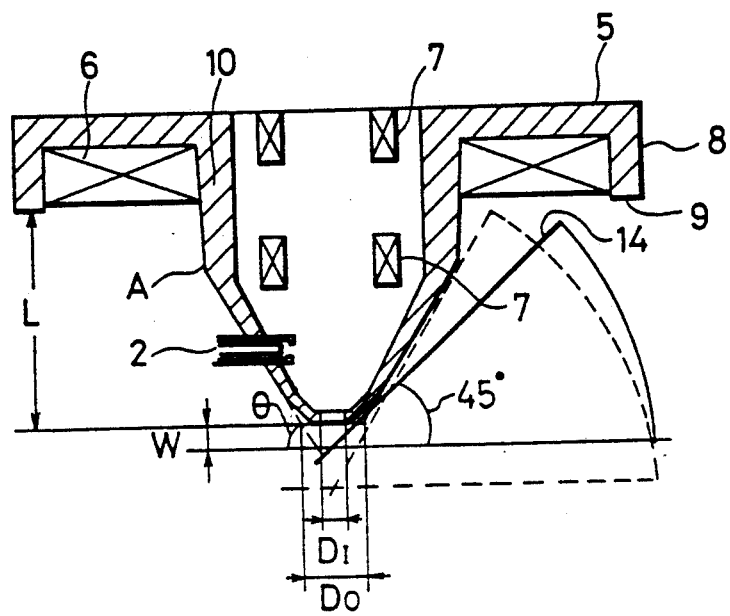
FIG. 2 is a cross-sectional detail view showing a modification of a unipolar magnetic field type objective lens according to the invention.
Figure 3:
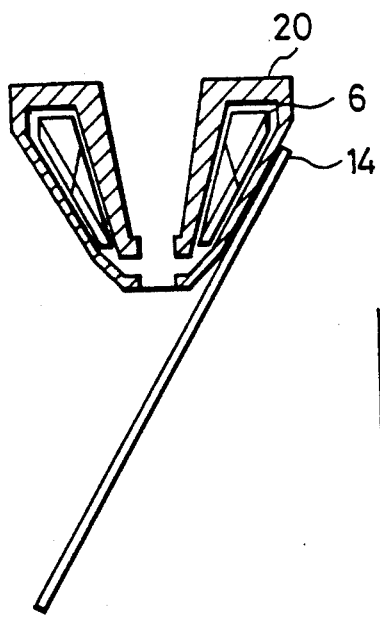
FIG. 3 is a cross-sectional detail view showing a conventional conical lens.

It is also possible to increase the magnetomotive force by providing a taper A at the cylindrical surface forming the base of the inner tube 10 of the unipolar magnetic field type objective lens, as shown in FIG. 2, to increase the cross-sectional area of the yoke of the base and to thereby prevent magnetic saturation at the base. Further, the resolution may be improved by making the angle of inclination smaller between the conical surface and the magnetic pole end surface 11 to thus enable a smaller sample distance W to be set. In this case, however, it is supposed that $D_o$ in equation (3) is the diameter of the intersecting circle between the projection of the tapered surface adjacent to the cylindrical surface of tube 10 and the plane of magnetic pole end surface 11 of inner tube 10.

The unipolar magnetic field objective lens 5 is excited by energizing focussing coils 6 of lens 5. The magnitude of the magnetomotive force J (i.e., (current flowing through the coil)×(number of turns of the coil)) thus generated is defined in dependence on the sample position W, the diameter $D_o$ of the magnetic pole end surface, the diameter $D_c$ of the cylinder of the inner tube, the angle of inclination $\Theta$ of the conical surface, and the distance between the magnetic pole surface 9 of the outer tube 8 and the magnetic pole end surface 11 of the inner tube 10. As described above, the magnetomotive force $J/\sqrt{U}$ is set to a value larger than the value of $J/\sqrt{U}$ given by equation (3). The electron beam flux emitted from the convergent lenses 3 is focused on the sample which is located at a distance W from the magnetic pole end surface 11 of inner tube 10 by the action of the unipolar magnetic field type objective lens 5 caused by the magnetomotive force.

The form of the inner tube of the unipolar magnetic field type objective lens may be as shown in FIG. 2. More specifically, an inclined surface having a smaller angle of inclination, e.g., about 45°, is arranged between the conical surface whose inclination $\Theta$ is about 60° and the magnetic pole end surface 11. Such an arrangement allows a sample to be positioned at a smaller distance W than is possible in FIG. 1 with an angle of inclination of about 30° or smaller, thereby contributing to improving the resolution. Also, the cylindrical surface constituting the base of the inner tube 10 may be formed, as shown at region A of FIG. 2, so that it is given a slight diverging inclination with respect to its vertical wall line. The cross-sectional area of the yoke is thus increased at the base (i.e., upper surface in FIG. 2) of the inner tube 10 to make itself less subject to magnetic saturation, thereby allowing a larger magnetomotive force to be applied. It is supposed that the diameter $D_o$ in this case is the intersecting circle between a surface extending from the inclined surface formed at an angle of inclination of about 60° and the magnetic pole end surface 11 of inner tube 10.

Although in FIG. 2 a slight inclination is given to the cylindrical surface forming the base of the inner tube 1 of the objective lens, as shown at region A of FIG. 2, to thereby provide a surface having a smaller angle of inclination between the conical surface and the magnetic pole end surface 11, it goes without saying that these surfaces may be constituted by separate pieces.

Figure 10:
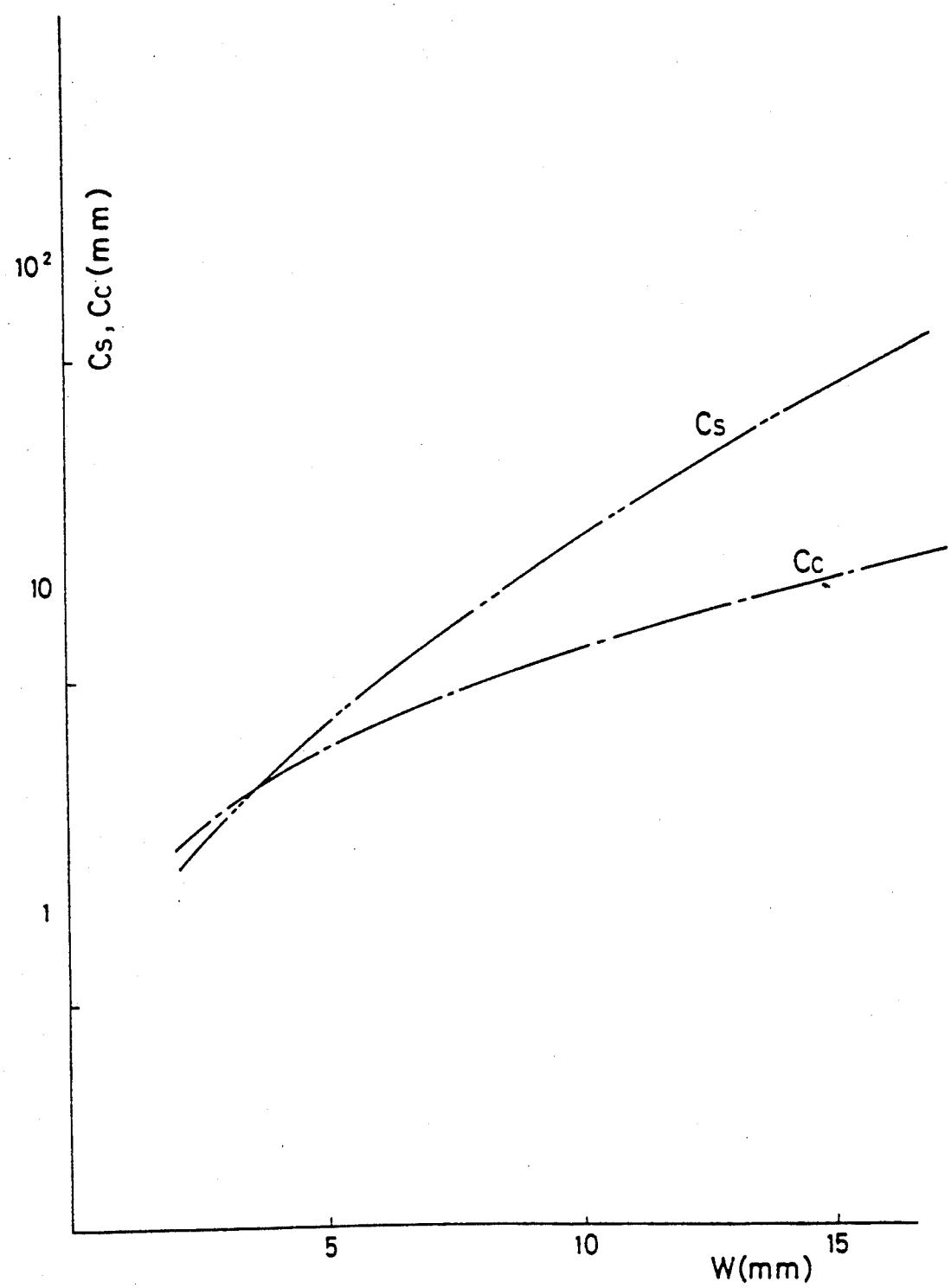
FIG. 10 is a diagram showing the relationship between the aberration coefficients $C_s$ and C and the working distance W in embodiments of the invention.
Figure 11:
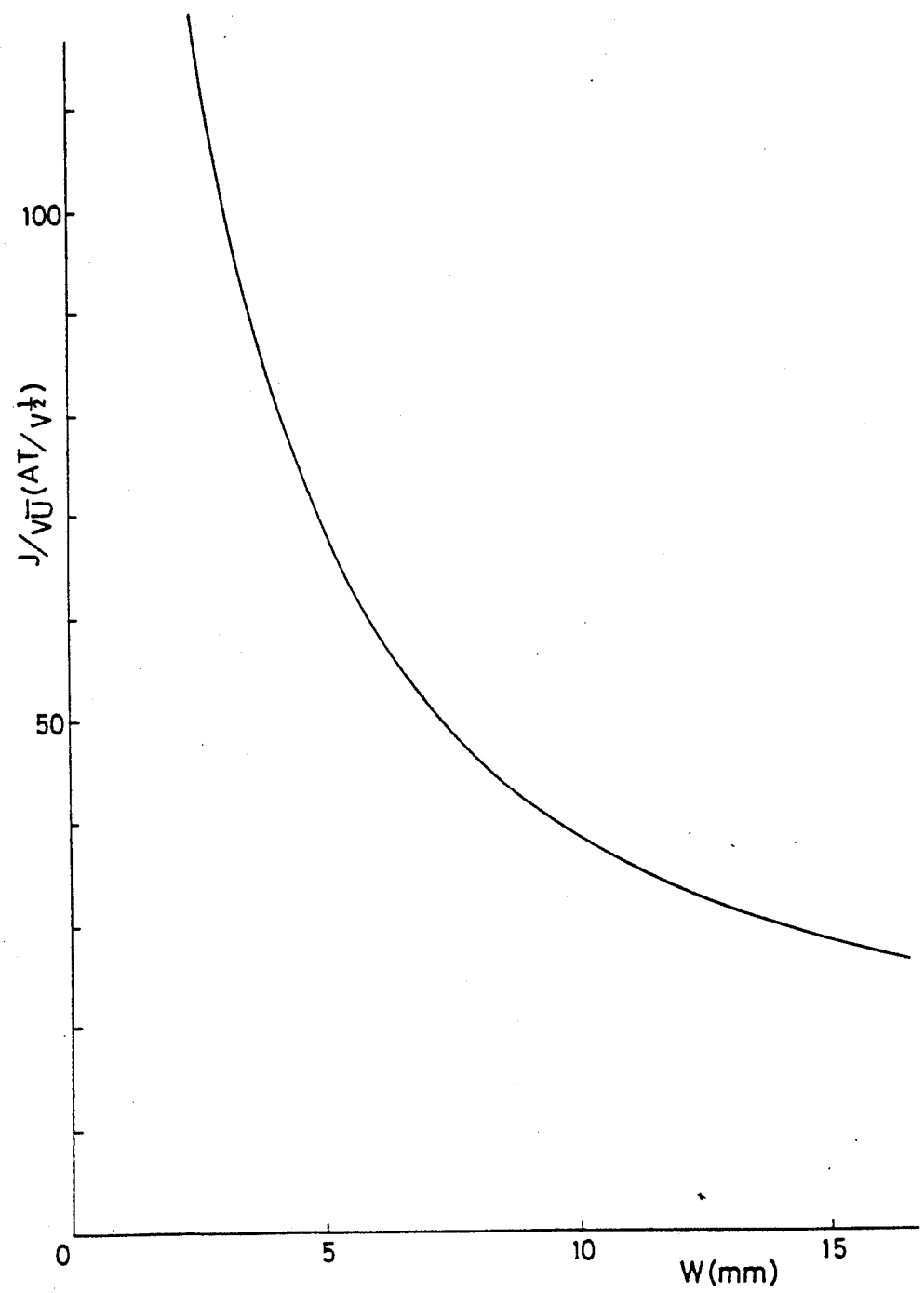
FIG. 11 is a diagram showing the relationship between the focusing magnetomotive force $J/\sqrt{U}$ and the working distance W.

FIG. 10 shows the relation between the aberration coefficients $C_s$ and $C_c$ of the embodiment shown in FIG. 1 and the working distance W. Also, FIG. 11 shows the relation between focusing magnetomotive force $J/\sqrt{U}$ and W. The parameters of the unipolar magnetic field type objective lens used in this analysis are as follows:

$D_0 = 14$ mm $D_i = 7$ mm $\Theta = 60°$ $D_c = 100$ mm $L = 100$ mm

Based on FIGS. 10 and 11, the focusing magnetomotive force, aberration coefficients $C_s$ and $C_c$, and the resolution can have values as shown in Table I:

TABLE I

| W (mm) | Max. Tilt Angl | $J/\sqrt{U}$ | $C_S$(mm) | $C_c$(mm) | δ(1 KV) |
|---|---|---|---|---|---|
| 15 | 60° | 28.5 | 4.1 | 10 | 10 nm |
| 5 | 30° | 69 | 3.7 | 3.0 | 5 nm |

A resolution (δ) of 10 nm can be obtained at an acceleration voltage of 1 KV and at a working distance of 15mm that allows an angle of inclination of 60° to be achieved. If the working distance is reduced to 5 mm, a resolution as high as 5 nm can be obtained. A still shorter working distance, which consequently reduces the aberration coefficients as shown in FIG. 10, further improves the resolution. However, this causes a drastic increase in the required focusing magnetomotive force $J/\sqrt{U}$ as shown in FIG. 11. In order to reduce both the required focusing magnetomotive force $J/\sqrt{U}$ and the aberration coefficients, the diameter D of the magnetic pole end surface 11 and the like may be reduced. For example, $C_s = 20$ mm and $C_c$ 5.5 mm can be obtained at the working distance allowing the sample to be inclined at 60° as indicated by FIG. 5, if $D_o = 10$ mm (and $D_i = 5$ mm).

However, it should be noted that an excessive reduction in the diameter $D_i$ of the hole arranged in the magnetic pole and surface causes the secondary electron detection efficiency to deteriorate with a low acceleration voltage and a large working distance. For example, if $D_i = 3$ mm, the acceleration voltage is 1 KV, and the angle of inclination 60°, the secondary electron detection efficiency falls to as low as 166 the value which it has when $D_i$ is nearly equal to 7mm. Thus, such a diameter is not practical.

Table II shows a comparison of resolution between the embodiment of this invention and conical lens that could provide the best resolution according to the prior art.

TABLE II

| W | This Invention | Prior Art (Conical lens) |
|---|---|---|
| 5 | 5 nm | 15 nm |
| 15 | 10 nm | 20 nm |

This invention provides a resolution of 10 nm with a working distance W of 15 mm and at an angle of inclination of a sample of 60°. A resolution of 5 nm is provided with W = 5mm and an angle of inclination of the sample being nearly equal to 30°.

That is, the resolution obtained by the invention is about twice the resolution of the conventional example with a large angle of inclination and about three times with a small angle of inclination, thereby providing an enormous advantage.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. An observation device for observing microscopic structures, comprising an electron beam source, including means for producing an acceleration voltage, for generating an electron beam with an energy dependent on the value of the acceleration voltage; means defining a sample location; and a unipolar magnetic field type objective lens disposed for focusing the electron beam at the sample location, said lens comprising an inner tube having an axis aligned with the electron beam and provided with an electron passage, a cylindrical base portion, and a magnetic pole end surface facing said sample location and disposed between said base portion and said sample location, said end surface being traversed by said passage, said lens further comprising a secondary electron beam detector located between said end surface and said electron beam source, and a focusing coil having a plurality of turns and connected to be supplied with a current for producing an electron beam focusing field, wherein:

said inner tube further comprises a conical portion extending between said base and said end surface, tapering toward said end surface and forming with said end surface an angle of between 50° and 70°;

said conical portion has an outer surface which intersects a plane containing said end surface at a circle of diameter $D_o$, the diameter of said electron passage, at said end surface, is $D_i$, and said conical portion intersects said base portion at a circle having a diameter $D_c$;

said tube is configured such that 4 mm $\leq D_i < D_o \leq 18$ mm $< D_c$;

said lens further comprises an outer tube surrounding said inner tube and having a magnetic pole surface which faces in the same direction as said end surface and which is located in a plane that is closer than said end surface to said beam source; and said coil is connected to receive a current having a value, and said inner tube is configured, such that:

$$J/\sqrt{U} > (7.1\,(D_o/W)+2.2)\cdot(0.19\,(D_c/D_o-1)+1),$$

where J is the product of the current, in amperes, through said focusing coil and the number of turns of said focusing coil, U is the electron beam acceleration voltage, in volts, $D_o$ and $D_c$ are in millimeters, and W is the distance between said end surface and said sample location.

2. An observation device as defined in claim 1 wherein said cylindrical base portion of said inner tube has an outer peripheral surface which is inclined with respect to said inner tube axis in a direction such that said outer peripheral surface tapers toward said conical portion.

3. An observation device as defined in claim 1 wherein said inner tube further comprises an additional portion interposed between said conical portion and said end surface and having an outer surface forming a smaller angle with said end surface than does said conical portion.

4. An observation device as defined in claim 3 wherein said cylindrical base portion of said inner tube has an outer peripheral surface which is inclined with respect to said inner tube axis in a direction such that said outer peripheral surface tapers toward said conical portion.

* * * * *